(12) United States Patent
Ooki (10) Patent No.: US 11,315,966 B2
(45) Date of Patent: Apr. 26, 2022

(54) SOLID-STATE IMAGING ELEMENT, MANUFACTURING METHOD, AND ELECTRONIC APPARATUS

(71) Applicant: SONY SEMICONDUCTOR SOLUTIONS CORPORATION, Kanagawa (JP)

(72) Inventor: Susumu Ooki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 195 days.

(21) Appl. No.: 16/651,438

(22) PCT Filed: Sep. 25, 2018

(86) PCT No.: PCT/JP2018/035262
§ 371 (c)(1),
(2) Date: Mar. 27, 2020

(87) PCT Pub. No.: WO2019/069733
PCT Pub. Date: Apr. 11, 2019

(65) Prior Publication Data
US 2020/0303438 A1    Sep. 24, 2020

(30) Foreign Application Priority Data

Oct. 6, 2017  (JP) .............................. JP2017-195936

(51) Int. Cl.
*H01L 27/146*    (2006.01)
(52) U.S. Cl.
CPC .. *H01L 27/14609* (2013.01); *H01L 27/14621* (2013.01); *H01L 27/14643* (2013.01); *H01L 27/14685* (2013.01)

(58) Field of Classification Search
CPC ......... H01L 27/14609; H01L 27/14621; H01L 27/14643; H01L 27/14685;
(Continued)

(56) References Cited

U.S. PATENT DOCUMENTS

2008/0303107 A1* 12/2008 Minamio ............. H04N 5/2257
257/432
2010/0025791 A1   2/2010 Ogawa et al.
(Continued)

FOREIGN PATENT DOCUMENTS

CN    108292662 A    7/2018
JP    07-022599 A    1/1995
(Continued)

OTHER PUBLICATIONS

International Search Report and Written Opinion of PCT Application No. PCT/JP2018/035262, dated Nov. 13, 2018, 10 pages of ISRWO.

*Primary Examiner* — Tony Ko
(74) *Attorney, Agent, or Firm* — Chip Law Group (57) ABSTRACT

The present disclosure relates to a solid-state imaging element, a manufacturing method, and an electronic apparatus capable of suppressing an adverse effect of high-order light of diffracted light on image quality. A glass plate material is bonded to a semiconductor substrate on which a pixel region in which a plurality of pixels is arranged is formed so that a gap is not provided between the glass plate material and the pixel region, and a low refractive index layer having a refractive index lower than that of the glass substrate is arranged on a resin layer between a low reflection film formed on a front surface of an on-chip lens arranged for every pixel and the glass plate material. The low refractive index layer is formed by a hole layer that includes a plurality of fine holes having a diameter smaller than a pitch of the pixels and a film that is formed so as to close the plurality (Continued)

of fine holes as hollows. The present technology can be applied to, for example, an imaging element chip having a cavityless structure.

9 Claims, 8 Drawing Sheets

(58) Field of Classification Search
CPC ........ H01L 27/14683; H01L 27/14625; G02B 1/118; G02B 3/00; H04N 5/357; H04N 5/369
See application file for complete search history.

(56) References Cited

U.S. PATENT DOCUMENTS

| | | | |
|---|---|---|---|
| 2013/0181313 A1* | 7/2013 | Nagata | H01L 27/14634 257/433 |
| 2017/0117320 A1 | 4/2017 | Matsugai | |
| 2017/0179180 A1* | 6/2017 | Kim | H01L 27/14625 |
| 2018/0204875 A1 | 7/2018 | Matsugai | |
| 2019/0244996 A1* | 8/2019 | Hirano | H01L 27/14623 |

FOREIGN PATENT DOCUMENTS

| | | |
|---|---|---|
| JP | 2010-040621 A | 2/2010 |
| JP | 2012-175461 A | 9/2012 |
| JP | 2013-041941 A | 2/2013 |
| JP | 2016-001681 A | 1/2016 |
| TW | 201603256 A | 1/2016 |
| WO | 2015/190070 A1 | 12/2015 |
| WO | 2017/094537 A1 | 6/2017 |

* cited by examiner

SOLID-STATE IMAGING ELEMENT, MANUFACTURING METHOD, AND ELECTRONIC APPARATUS

CROSS REFERENCE TO RELATED APPLICATIONS

This application is a U.S. National Phase of International Patent Application No. PCT/JP2018/035262 filed on Sep. 25, 2018, which claims priority benefit of Japanese Patent Application No. JP 2017-195936 filed in the Japan Patent Office on Oct. 6, 2017. Each of the above-referenced applications is hereby incorporated herein by reference in its entirety.

TECHNICAL FIELD

The present disclosure relates to a solid-state imaging element, a manufacturing method, and an electronic apparatus, and particularly to a solid-state imaging element, a manufacturing method, and an electronic apparatus capable of suppressing an adverse effect of high-order light of diffracted light on image quality.

BACKGROUND ART

Conventionally, in a solid-state imaging element, a cavity structure in which a gap is provided between a semiconductor substrate and a glass substrate or a cavityless structure in which the gap is not provided between the semiconductor substrate and the glass substrate has been adopted as a structure in which the glass substrate is bonded to the semiconductor substrate in order to seal a pixel region in which a plurality of pixels is arranged.

For example, in the solid-state imaging element having the cavity structure, high-order light of diffracted light reflected on a front surface of the semiconductor substrate and incident on the glass substrate was totally reflected on a front surface and a back surface of the glass substrate, such that a situation where the high-order light returns to the pixel region is avoided.

In contrast, in the solid-state imaging element having the cavityless structure, high-order light of diffracted light reflected on a front surface of the semiconductor substrate and incident on the glass substrate might return to the pixel region without being totally reflected on a back surface of the glass substrate after being totally reflected on a front surface of the glass substrate. In other words, in the cavityless structure, a resin having a refractive index (1.51) similar to that of the glass substrate is embedded between the semiconductor substrate and the glass substrate, such that light reflected on a semiconductor front surface is in a form in which it is emitted from a high reflection medium to air (low refractive index medium). Therefore, when an angle of the light is a critical angle or more, total reflection is generated. This light might return to the pixel region, such that the high-order light of the diffracted light becomes ring-shaped flare to have an adverse effect on image quality.

Therefore, as disclosed in Patent Documents 1 and 2, an imaging device that suppresses generation of flare light by a control film shifting a cutoff wavelength to a shorter wavelength side according to an incident angle of obliquely incident light has been developed.

CITATION LIST

Patent Document

Patent Document 1: Japanese Patent Application Laid-Open No. 2012-175461
Patent Document 2: Japanese Patent Application Laid-Open No. 2013-41941

SUMMARY OF THE INVENTION

Problems to be Solved by the Invention

Furthermore, conventionally, in order to suppress the generation of the flare light, for example, an anti-reflection structure using an anti-reflection (AR) coat on a semiconductor substrate surface may be used as a technology of suppressing reflection on the semiconductor substrate surface. However, since such a structure cannot exhibit an effect of suppressing reflection from a color filter surface or an optical black surface above the semiconductor substrate surface, high-order light of diffracted light due to this reflection might have an adverse effect on image quality.

The present disclosure has been made in view of such a situation, and an object of the present disclosure is to be capable of suppressing an adverse effect of high-order light of diffracted light on image quality.

Solutions to Problems

A solid-state imaging element according to an aspect of the present disclosure includes a semiconductor substrate on which a pixel region in which a plurality of pixels is arranged is formed, a glass plate material that is bonded to the semiconductor substrate so that a gap is not provided between the glass plate material and the pixel region, and a low refractive index layer that is arranged on a resin layer between a low reflection film and the glass plate material and has a refractive index lower than that of the glass substrate, the low reflection film being formed on a front surface of an on-chip lens arranged for every pixel.

A manufacturing method according to an aspect of the present disclosure is a manufacturing method of a solid-state imaging element, the solid-state imaging element including a semiconductor substrate on which a pixel region in which a plurality of pixels is arranged is formed, a glass plate material that is bonded to the semiconductor substrate so that a gap is not provided between the glass plate material and the pixel region, and a low refractive index layer that is arranged on a resin layer between a low reflection film and the glass plate material and has a refractive index lower than that of the glass substrate, the low reflection film being formed on a front surface of an on-chip lens arranged for every pixel, the manufacturing method including forming the low refractive index layer, in which the forming of the low refractive index layer includes forming a hole layer on a front surface of a resin layer, the hole layer including a plurality of fine holes having a diameter smaller than a pitch of the pixels, the resin layer being formed at a thickness less than an interval from a bonded surface between a sensor substrate having the semiconductor substrate and a glass substrate having the glass plate material to the glass plate material so as to be stacked on the low reflection film, and forming a film so as to close the plurality of fine holes as hollows.

An electronic apparatus according to an aspect of the present disclosure includes: a solid-state imaging element, in which the solid-state imaging element includes a semiconductor substrate on which a pixel region in which a plurality of pixels is arranged is formed, a glass plate material that is bonded to the semiconductor substrate so that a gap is not provided between the glass plate material and the pixel region, and a low refractive index layer that is arranged on a resin layer between a low reflection film and the glass plate material and has a refractive index lower than that of the glass substrate, the low reflection film being formed on a front surface of an on-chip lens arranged for every pixel.

In an aspect of the present disclosure, the glass plate material is bonded to the semiconductor substrate on which the pixel region in which the plurality of pixels is arranged is formed so that the gap is not provided between the glass plate material and the effective pixel region, and the low refractive index layer having the refractive index lower than that of the glass substrate is arranged on the resin layer between the low reflection film formed on the front surface of the on-chip lens arranged for every pixel and the glass plate material.

Effects of the Invention

According to an aspect of the present disclosure, it is possible to suppress an adverse effect of high-order light of diffracted light on image quality Note that an effect described here is not necessarily limited, and may be any effect described in the present disclosure.

MODE FOR CARRYING OUT THE INVENTION

Hereinafter, specific embodiments to which the present technology is applied will be described in detail with reference to the drawings.
<First Configuration Example of Imaging Element Chip>

Figure 1:
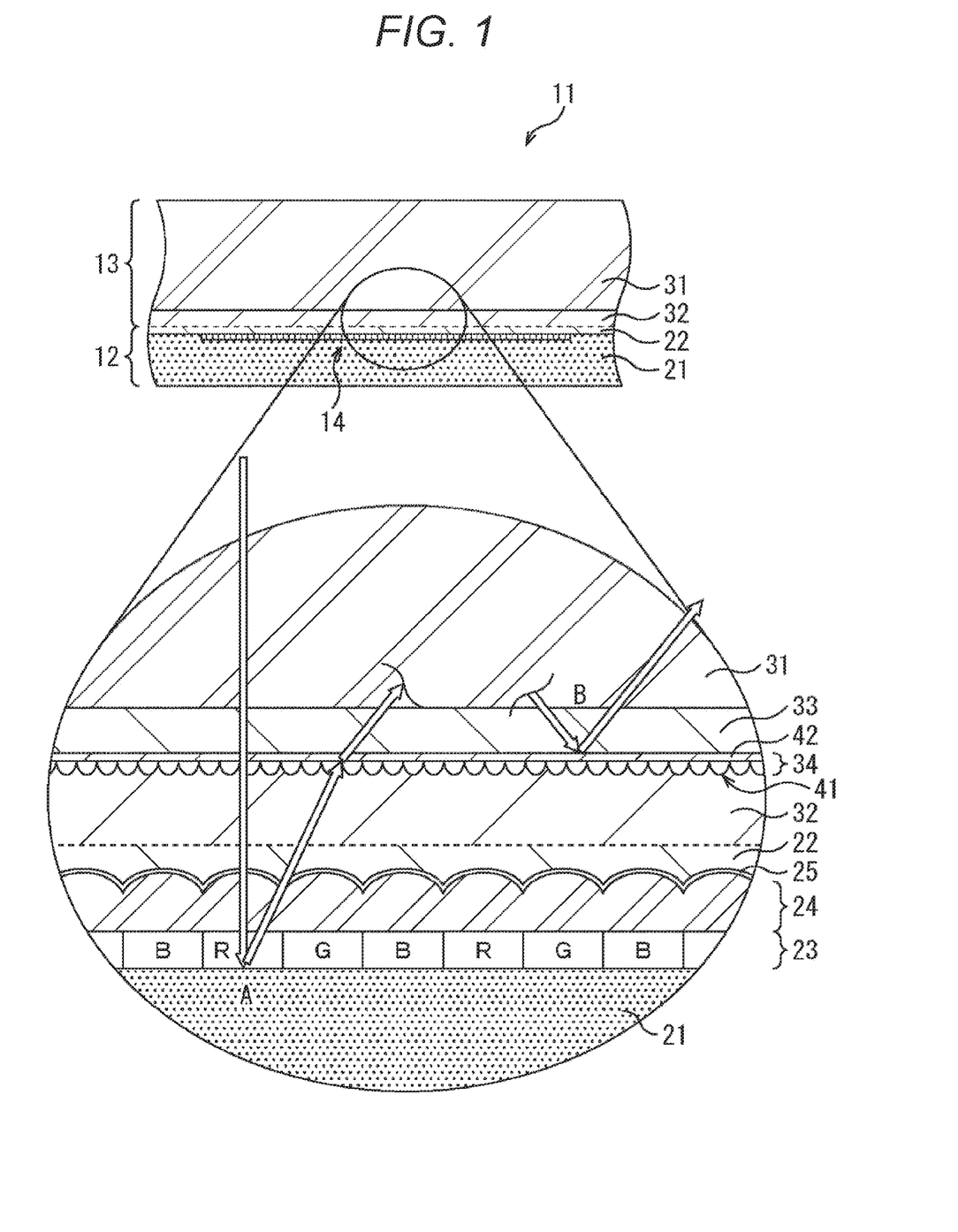
FIG. 1 is a cross-sectional view illustrating a configuration example of a first embodiment of an imaging element chip to which the present technology is applied.

FIG. 1 is a view illustrating a configuration example of a first embodiment of an imaging element chip to which the present technology is applied.

As illustrated in FIG. 1, an imaging element chip 11 has a cavityless type wafer level chip size package (WLCSP) structure configured by bonding a glass substrate 13 to a sensor substrate 12 so that a gap is not generated between the sensor substrate 12 and the glass substrate 13. The imaging element chip 11 having such a structure has a configuration robust to a change in a pixel size or a chip size because it is possible to make stress uniform by embedding a resin and it is possible to optimize a structure such as glass, resin, light condensing or the like by an optical design.

The sensor substrate 12 is configured by stacking a glass seal resin 22 for bonding a semiconductor substrate 21 to the glass substrate 13 on the semiconductor substrate 21 on which an effective pixel region 14 in which a plurality of effective pixels is arranged in an array shape is formed. The glass substrate 13 is configured by stacking a glass seal resin 32 for bonding a glass plate material 31 to the semiconductor substrate 21 on the glass plate material 31 for sealing the effective pixel region 14 of the sensor substrate 12.

Furthermore, the imaging element chip 11 has a structure in which many layers are stacked between the semiconductor substrate 21 and the glass plate material 31, as illustrated in a lower side of FIG. 1. Note that a broken line in FIG. 1 indicates a bonded surface between the sensor substrate 12 and the glass substrate 13.

In other words, the sensor substrate 12 is configured by stacking a color filter layer 23, an on-chip lens layer 24, a low reflection film 25, and the glass seal resin 22 sequentially from a semiconductor substrate 21 side. Furthermore, the glass substrate 13 is configured by stacking the glass seal resin 32, a pseudo low refractive index layer 34, and a glass seal resin 33 sequentially from a bonded surface side with the sensor substrate 12.

The color filter layer 23 is a layer in which a filter R, G, or B transmitting light of a color received for every pixel is arranged for every pixel of the effective pixel region 14. The on-chip lens layer 24 is a layer in which a small lens condensing incident light is arranged for every pixel of the effective pixel region 14. The low reflection film 25 is formed in order to suppress reflection on a front surface of the on-chip lens layer 24.

The glass seal resin 33 is used for bonding the semiconductor substrate 21 and the glass substrate 13 to each other, similar to the glass seal resins 22 and 32.

The pseudo low refractive index layer 34 is arranged so as to be sandwiched between glass seal resins 32 and 33 that are between the low reflection film 25 formed on the front surface of the on-chip lens layer 24 and the glass plate material 31, and is formed to so as to have a refractive index (refractive index: less than 1.51) lower than that of the glass plate material 31. For example, the pseudo low refractive index layer 34 is formed by a hole layer 41 and an oxide film 42, as illustrated in FIG. 1.

The hole layer 41 is a layer in which a plurality of fine holes having a diameter smaller than a pitch of pixels arranged in the effective pixel region 14 is formed in a pattern of a regular interval in a front surface of the glass seal resin 32. Specifically, the hole layer 41 is a group of fine holes formed so as to have a diameter of about 1/10 of the pitch of the pixels arranged in the effective pixel region 14. The oxide film 42 is formed by, for example, low temperature oxide (LTO) or the like so as to close the plurality of fine holes of the hole layer 41 as hollows.

Therefore, the pseudo low refractive index layer 34 has a configuration in which a refractive index on the front surface of the glass seal resin 32 is reduced in a pseudo manner by using air enclosed by the hole layer 41 and the oxide film 42. For example, it is preferable that the pseudo low refractive index layer 34 has a thickness of about 10 μm to 15 μm.

In the imaging element chip 11 having such a configuration, it is possible to make stress uniform by bonding the sensor substrate 12 and the glass substrate 13 to each other in a cavityless manner, and it is possible to improve image quality by suppressing the generation of the ring-shaped flare as described above. In other words, in the imaging element chip 11, for example, high-order light of diffracted light reflected on a front surface (position A in FIG. 1) of the semiconductor substrate 21 and incident on the glass plate material 31 is totally reflected on the pseudo low refractive index layer 34 (position B in FIG. 1) after being totally reflected on a front surface of the glass plate material 31.

Therefore, in the imaging element chip 11, reflection is repeated between the front surface of the glass plate material 31 and the pseudo low refractive index layer 34, such that it is possible to propagate light toward a side surface of the glass plate material 31. Therefore, in the imaging element chip 11, it is possible to avoid a situation where the high-order light of the diffracted light reflected on the front surface (position A in FIG. 1) of the semiconductor substrate 21 and incident on the glass plate material 31 returns to the effective pixel region 14. As a result, it is possible to suppress the generation of the ring-shaped flare.

As such, in the imaging element chip 11, by providing the pseudo low refractive index layer 34, it is possible to suppress an adverse effect of the high-order light of the diffracted light on the image quality even though the imaging element chip 11 has a cavityless structure. Of course, in the imaging element chip 11, with respect to reflection on a front surface of the color filter layer 23 or the on-chip lens layer 24, similarly, it is possible to suppress an adverse effect of high-order light of diffracted light on the image quality.

Note that a structure of the pseudo low refractive index layer 34 is not limited to including the hole layer 41 and the oxide film 42, but may include, for example, a resin layer having a refractive index lower than the refractive index (1.51) of the glass plate material 31. In addition, porous silicon dioxide (SiO2) may be used as a material of the pseudo low refractive index layer 34, or a low refractive index material on a high refractive index layer may be used as a material of the pseudo low refractive index layer 34.

Here, the diffracted light will be described with reference to FIGS. 2A, 2B and 3.

Figure 2A:
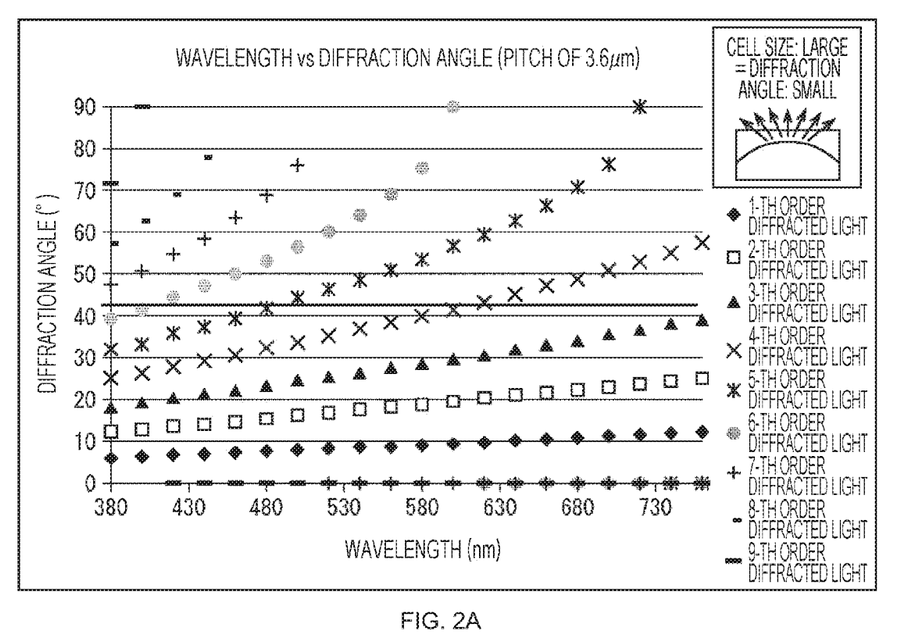
FIGS. 2A and 2B are views for describing a relationship between a cell size, a wavelength, and a diffraction angle.
Figure 2B:
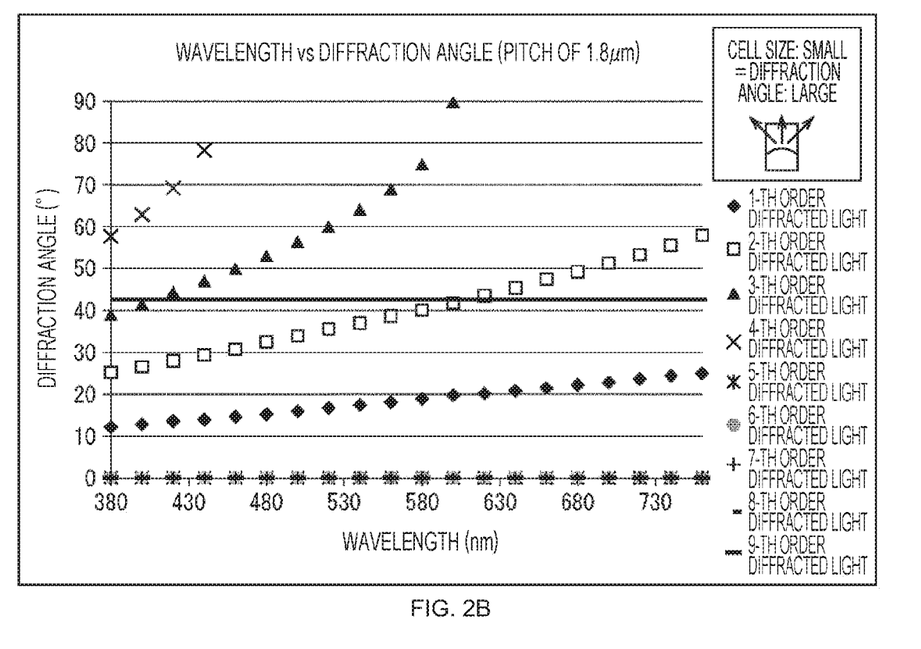

FIG. 2A illustrates a relationship between a wavelength and a diffraction angle in a configuration (pitch of 3.6 μm) in which a cell size is large, and FIG. 2B illustrates a relationship between a wavelength and a diffraction angle in a configuration (pitch of 1.8 μm) in which a cell size is small.

In general, the effective pixel region 14 has a periodic structure by repetition of a pixel structure, and generates high-order diffracted light by diffracting light reflected from the front surface of the semiconductor substrate 21 such as silicon. Then, ring-shaped flare is generated due to high-order light incident on an interface between glass and air beyond a critical angle.

Furthermore, an angle at which the diffracted light is reflected is determined by a pitch of pixels generating the diffraction. In other words, in a structure in which the pitch of the pixels is small as illustrated in FIG. 2B, an angle of the high-order diffracted light becomes wider (closer to the critical angle), and in a structure in which a pitch of the pixels is large as illustrated in FIG. 2A, an angle of the high-order diffracted light becomes narrower.

For example, in a configuration (for example, up to 2.0 μm) of a cell size adopted in a mobile terminal, an angle of substantially 3-th order light exceeds the critical angle, such that light reflected from the front surface of the semiconductor substrate 21 and incident on the pixels is diffracted light of the 3-th order light or higher. As such, the light reflected from the front surface of the semiconductor substrate 21 and incident on the pixels is the diffracted light of the 3-th order light or higher.

Figure 3:
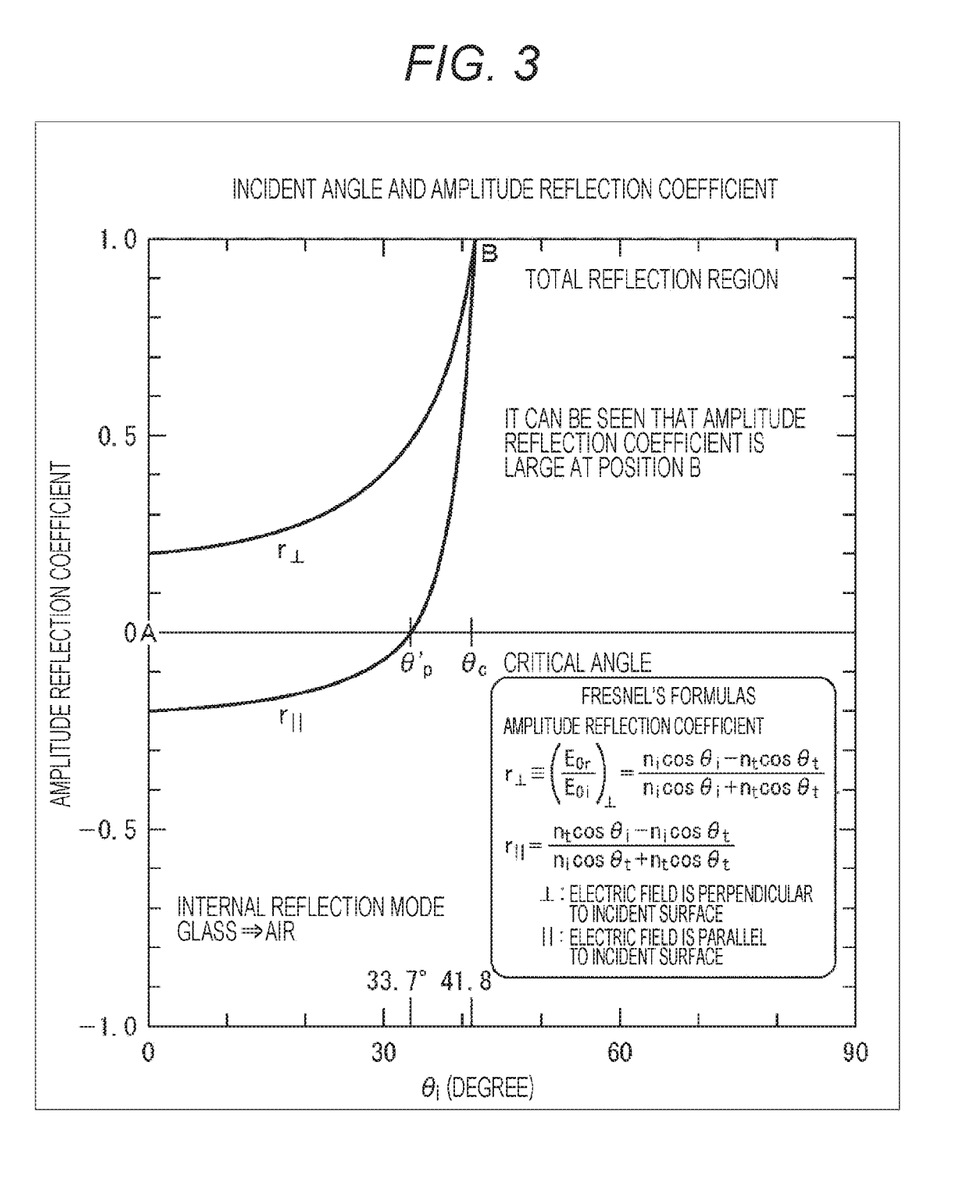
FIG. 3 is a view for describing a relationship between an incident angle and an amplitude reflection coefficient.

Here, FIG. 3 illustrates a relationship between an incident angle and an amplitude reflection coefficient according to Fresnel's formulas. Curved lines in FIG. 3 are amplitude reflection coefficients as a function of the incident angle and are internal reflection from glass to air, and as illustrated by these curved lines, a reflectivity is a variable of the incident angle.

As illustrated, an amplitude reflection coefficient at the position B (see FIG. 1) where the incident angle is equal to or larger than the critical angle is larger than an amplitude reflection coefficient at the position A (see FIG. 1) where the incident angle is 0 degree. As such, it can be seen from Fresnel's formulas illustrated in FIG. 3 that it is correct that the amplitude reflection coefficient is changed depending on the incident angle.

<Manufacturing Method of Imaging Element Chip>

A manufacturing method of the imaging element chip 11 will be described with reference to FIG. 4. Note that FIG. 4 illustrates a manufacturing process when the glass plate material 31 is first bonded at the time of putting a wafer of the sensor substrate 12 formed up to the on-chip lens layer 24 into a chip size package (CSP) process.

Figure 4:
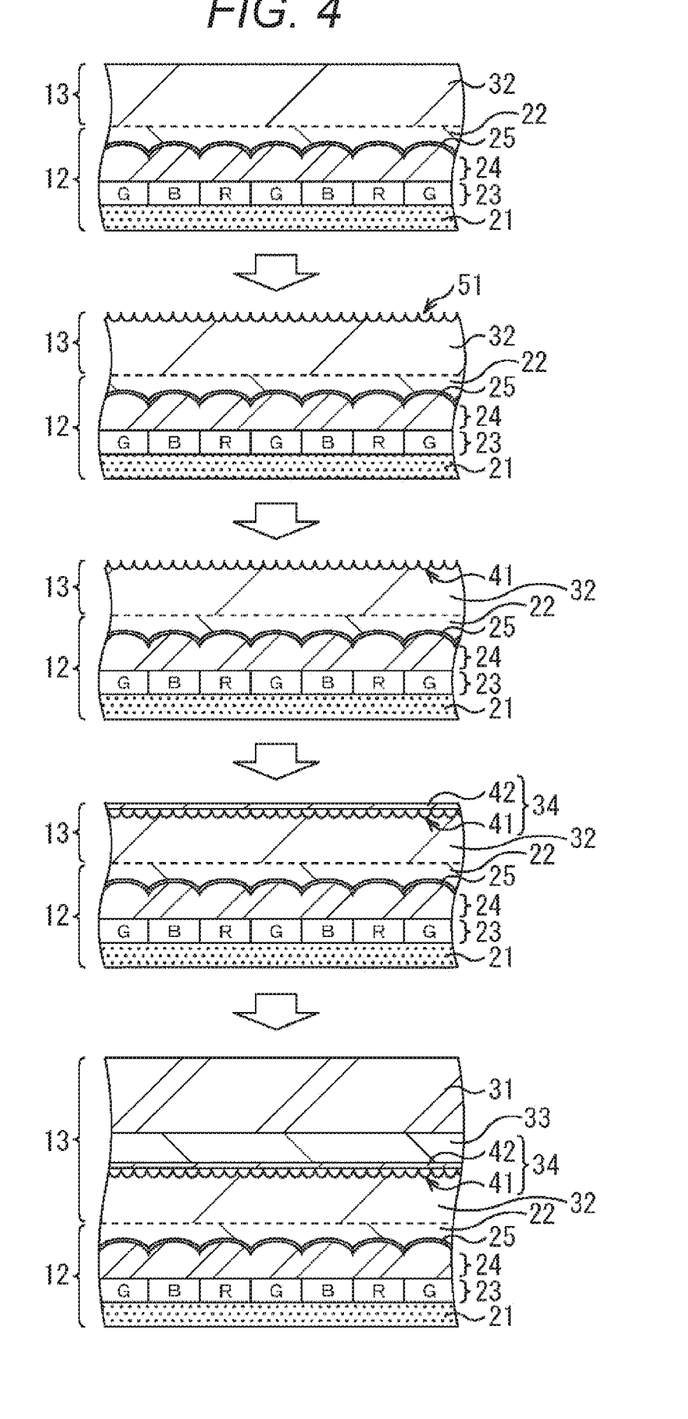
FIG. 4 is a view for describing a manufacturing method of the imaging element chip.

In a first process, by applying a resin material to the on-chip lens layer 24 of the sensor substrate 12, the glass seal resin 22 and the glass seal resin 32 are formed as illustrated in a first stage from the top in FIG. 4. At this time, the glass seal resin 32 on a glass substrate 13 side is formed to have a thickness (for example, about 25 μm) that is approximately half the interval from a bonded surface with the sensor substrate 12 to the glass plate material 31.

In a second process, after baking is performed on the front surface of the glass seal resin 32, directed self assembly (DSA): a nanostructure using a self-assembly phenomenon of a block copolymer) or nanoprinting is performed. Therefore, as illustrated in a second stage from the top in FIG. 4, a pattern 51 of a fine concave shape (for example, a periodic pattern having a size of 100 nm or less) is formed on the front surface of the glass seal resin 32.

In a third process, by transferring the pattern of the fine concave shape 51 to the glass seal resin 32, a pattern of fine holes that becomes the hole layer 41 is formed in the glass seal resin 32, as illustrated in a third stage from the top in FIG. 4.

In a fourth process, an oxide film 42 is formed on the glass seal resin 32. At this time, as illustrated in a fourth stage from the top in FIG. 4, air is enclosed in the hole layer 41 by closing the hole layer 41 by the oxide film 42, such that the pseudo low refractive index layer 34 is formed.

In a fifth process, the glass seal resin 33 is applied to the oxide film 42, and the glass plate material 31 is bonded by the glass seal resin 33 as illustrated in the fourth stage from the top in FIG. 4.

Through the processes described above, the imaging element chip 11 including the pseudo low refractive index layer 34 as illustrated in FIG. 1 can be manufactured. Therefore, in the imaging element chip 11, the refractive index of the pseudo low refractive index layer 34 can be reduced as much as possible by enclosing the air in the fine holes of the hole layer 41.

<Formation Region of Pseudo Low Refractive Index Layer>

Figure 5:
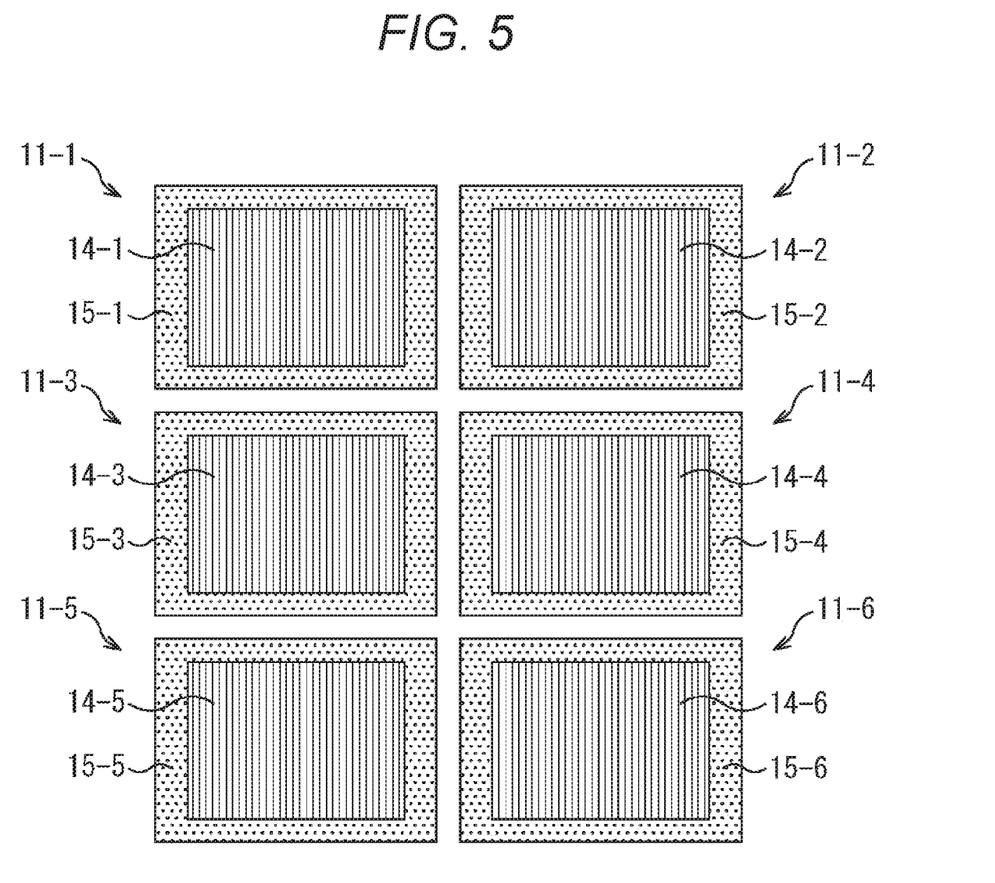
FIG. 5 is a view for describing a formation region of a pseudo low refractive index layer.

A formation region of the pseudo low refractive index layer 34 will be described with reference to FIG. 5. FIG. 5 illustrates a plurality of imaging element chips 11 (six imaging element chips 11-1 to 11-6 in an example of FIG. 5) when viewed in a plan view.

The manufacturing process described with reference to FIG. 4 is performed on a semiconductor wafer before the imaging element chips 11 is singulated, and a plurality of imaging element chips 11 is formed on the semiconductor wafer. Furthermore, a region including a peripheral region 15 surrounding the effective pixel region 14 is a region that becomes a product of the imaging element chip 11, and a scribe for dicing is provided between the respective imaging element chips 11.

Then, the pseudo low refractive index layer 34 is formed in a region other than the scribe between the imaging element chips 11, in other words, a region that is inside the peripheral region 15 and covers at least an entire surface of the effective pixel region 14. Alternatively, it is preferable that the pseudo low refractive index layer 34 is formed only in the effective pixel region 14. For example, when the imaging element chip 11 is singulated, if processing is performed on the pseudo low refractive index layer 34, there is a possibility that fine dust or the like will be generated. Therefore, in the second process of FIG. 4, in order to avoid the generation of such fine dust, it is preferable to perform the DSA or the nanoprinting using the effective pixel region 14 as the formation region of the pseudo low refractive index layer 34.

<Second and Third Configuration Examples of Imaging Element Chip>

Second and third configuration examples of the imaging element chip 11 will be described with reference to FIGS. 6A and 6B. Note that, in imaging element chips 11A and 11B illustrated in FIGS. 6A and 6B, the same components as those of the imaging element chip 11 of FIG. 1 are denoted by the same reference numerals, and a detailed description thereof will be omitted.

Figure 6A:
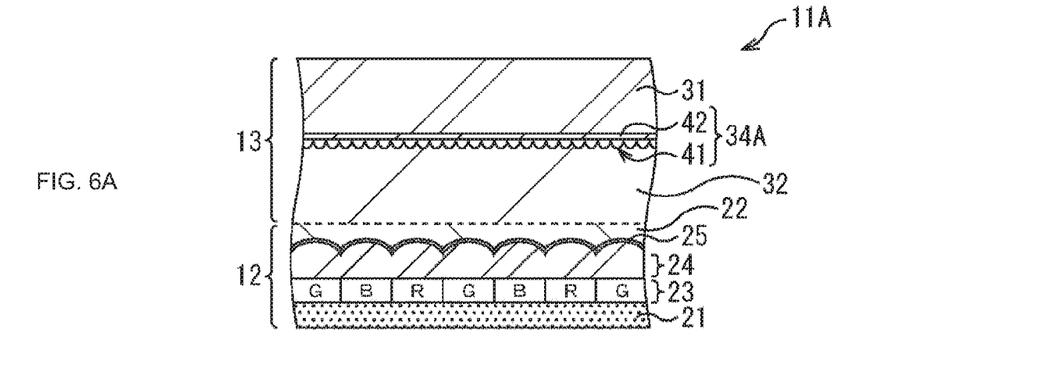
FIGS. 6A and 6B are cross-sectional views illustrating second and third configuration examples of the imaging element chip.
Figure 6B:
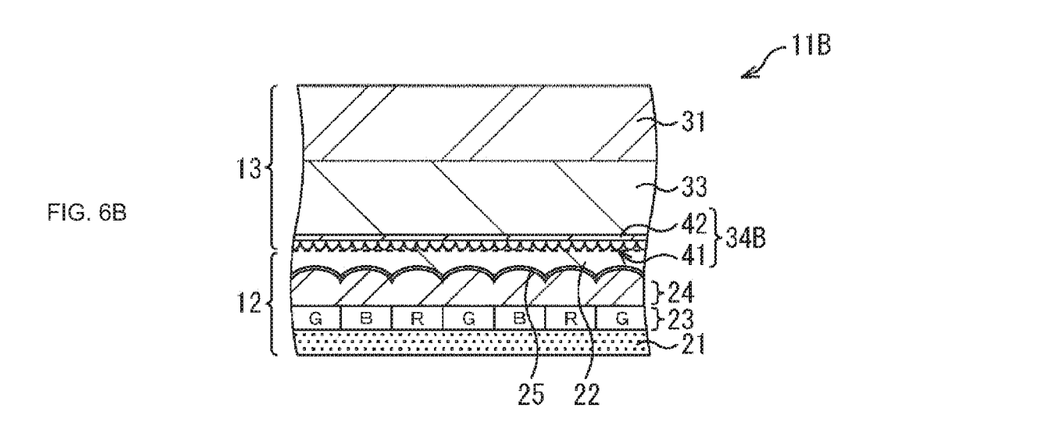

FIG. 6A illustrates a cross-sectional configuration of an imaging element chip 11A that is a second configuration example, and FIG. 6B illustrates a cross-sectional configuration of an imaging element chip 11B that is a third configuration example.

As illustrated in FIG. 6A, the imaging element chip 11A has a structure in which a pseudo low refractive index layer 34A is arranged so as to be in contact with a lower surface of a glass plate material 31.

As illustrated in FIG. 6B, the imaging element chip 11B has a structure in which a pseudo low refractive index layer 34B is arranged so as to be in contact with a bonded surface with a sensor substrate 12.

As such, in the imaging element chip 11, the pseudo low refractive index layer 34 may be arranged anywhere between the low reflection film 25 formed on the front surface of the on-chip lens layer 24 and the glass plate material 31. In other words, even with a configuration of the imaging element chip 11A or a configuration of the imaging element chip 11B, it is possible to suppress the generation of the ring-shaped flare as described above.

<Configuration Example of Electronic Apparatus>

The imaging element chip 11 as described above may be applied to various electronic apparatuses such as, for example, an imaging system such as a digital still camera, a digital video camera or the like, a mobile phone having an imaging function, or another apparatus having an imaging function.

Figure 7:
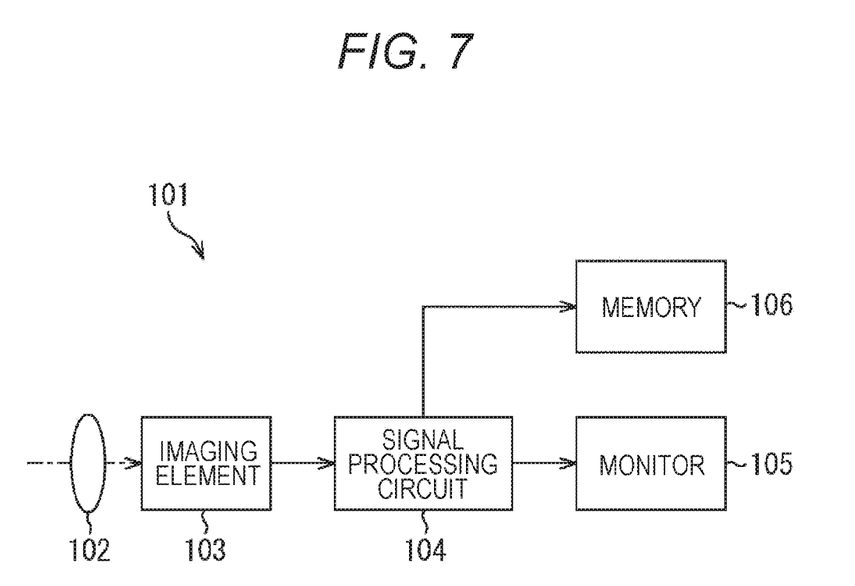
FIG. 7 is a block diagram illustrating a configuration example of an imaging device.

FIG. 7 is a block diagram illustrating a configuration example of an imaging device mounted in an electronic apparatus.

As illustrated in FIG. 7, an imaging device 101 includes an optical system 102, an imaging element 103, a signal processing circuit 104, a monitor 105, and a memory 106, and can capture a still image and a moving image.

The optical system 102 includes one or a plurality of lenses, guides image light (incident light) from a subject to the imaging element 103, and forms an image on a light receiving surface (sensor unit) of the imaging element 103.

As the imaging element 103, the imaging element chip 11 described above is applied. In the imaging element 103, electrons are accumulated for a certain period according to an image formed on the light receiving surface through the optical system 102. Then, a signal corresponding to the electrons accumulated in the imaging element 103 is supplied to the signal processing circuit 104.

The signal processing circuit 104 performs various signal processing on a pixel signal output from the imaging element 103. An image (image data) obtained by performing signal processing by the signal processing circuit 104 is supplied to and displayed on the monitor 105 or is supplied to and stored (recorded) in the memory 106.

In the imaging device 101 configured as such, by applying the imaging element chip 11 described above, it is possible to capture, for example, an image having a higher image quality without ring-shaped flare.

<Use Example of Image Sensor>

Figure 8:
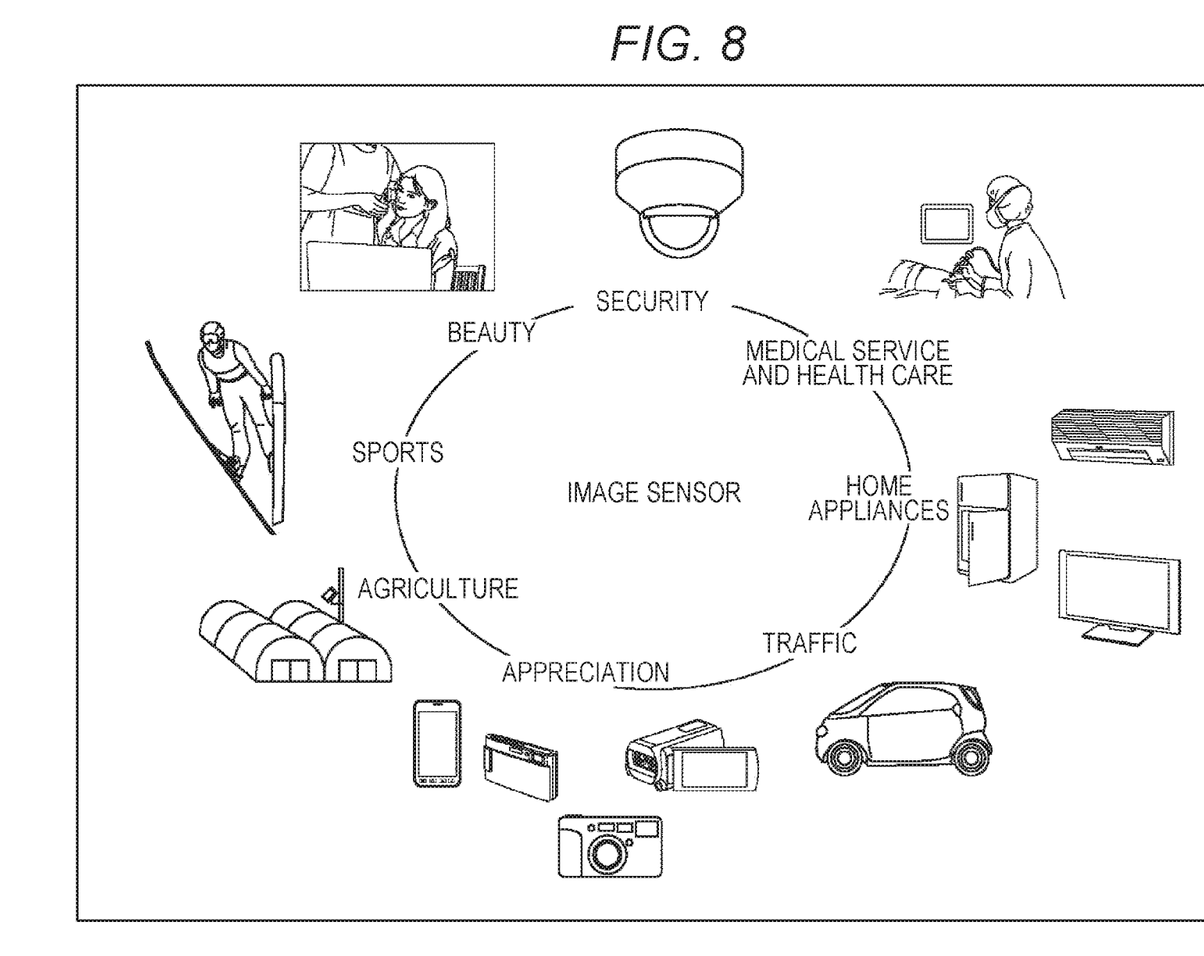
FIG. 8 is a view illustrating a use example in which an image sensor is used.

FIG. 8 is a view illustrating a usage example in which the image sensor (imaging element) described above is used.

The image sensor described above can be used, for example, in various cases of sensing light such as visible light, infrared light, ultraviolet light, X-rays, and the like as described below.

- A device capturing an image provided for appreciation, such as a digital camera, a portable apparatus with a camera function, or the like
- A device provided for traffic, such as an in-vehicle sensor imaging the front or the rear, surroundings, the inside, and the like, of a vehicle, a monitoring camera monitoring a traveling vehicle and a road, a distance measurement sensor measuring a distance between vehicles, or the like, for safe driving such as automatic stop or the like, recognition of a driver state or the like
- A device provided for home appliances such as a television (TV), a refrigerator, an air conditioner, and the like, in order to image a user's gesture and perform an apparatus operation depending on the gesture
- A device provided for medical service and healthcare, such as endoscopes, a device performing blood vessel imaging by receiving infrared light, or the like
- A device provided for security, such as a monitoring camera for crime prevention, a camera for person authentication, or the like
- A device provided for beauty, such as a skin measuring instrument imaging the skin, a microscope imaging the scalp, or the like
- A device provided for sports, such as an action camera, a wearable camera for sports, or the like
- A device provided for agriculture, such as a camera or the like monitoring a condition of fields or crops <Combination Example of Configuration>

Note that the present technology can also have the following configuration.

(1)

A solid-state imaging element including:

a semiconductor substrate on which a pixel region in which a plurality of pixels is arranged is formed;

a glass plate material that is bonded to the semiconductor substrate so that a gap is not provided between the glass plate material and the pixel region; and a low refractive index layer that is arranged on a resin layer between a low reflection film and the glass plate material and has a refractive index lower than that of the glass plate material, the low reflection film being formed on a front surface of an on-chip lens arranged for every pixel.

(2)

The solid-state imaging element according to the above (1), in which the low refractive index layer is formed by a hole layer that is formed on a front surface of a resin layer and includes a plurality of fine holes having a diameter smaller than a pitch of the pixels, the resin layer being formed at a thickness less than an interval from a bonded surface between a sensor substrate having the semiconductor substrate and a glass substrate having the glass plate material to the glass plate material so as to be stacked on the low reflection film; and a film that is formed so as to close the plurality of fine holes as hollows.

(3)

The solid-state imaging element according to the above (1) or (2), in which the low refractive index layer includes a resin layer having a refractive index lower than that of the glass plate material.

(4)

The solid-state imaging element according to any one of the above (1) to (3), in which the low refractive index layer is formed at a thickness of 10 μm to 15 μm.

(5)

The solid-state imaging element according to any one of the above (1) to (4), in which the low refractive index layer is formed only in the pixel region when the semiconductor substrate is viewed in a plan view.

(6)

The solid-state imaging element according to any one of the above (1) to (5), in which the low refractive index layer is arranged so as to be in contact with the glass plate material.

(7)

The solid-state imaging element according to any one of the above (1) to (6), in which the low refractive index layer is arranged so as to be in contact with a bonded surface between a sensor substrate having the semiconductor substrate and a glass substrate having the glass plate material.

(8)

A manufacturing method of a solid-state imaging element, the solid-state imaging element including a semiconductor substrate on which a pixel region in which a plurality of pixels is arranged is formed, a glass plate material that is bonded to the semiconductor substrate so that a gap is not provided between the glass plate material and the pixel region, and a low refractive index layer that is arranged on a resin layer between a low reflection film and the glass plate material and has a refractive index lower than that of the glass plate material, the low reflection film being formed on a front surface of an on-chip lens arranged for every pixel, the manufacturing method including:

forming the low refractive index layer, in which the forming of the low refractive index layer includes:

forming a hole layer on a front surface of a resin layer, the hole layer including a plurality of fine holes having a diameter smaller than a pitch of the pixels, the resin layer being formed at a thickness less than an interval from a bonded surface between a sensor substrate having the semiconductor substrate and a glass substrate having the glass plate material to the glass plate material so as to be stacked on the low reflection film; and forming a film so as to close the plurality of fine holes as hollows.

(9)

An electronic apparatus including a solid-state imaging element, in which the solid-state imaging element includes:

a semiconductor substrate on which a pixel region in which a plurality of pixels is arranged is formed;

a glass plate material that is bonded to the semiconductor substrate so that a gap is not provided between the glass plate material and the pixel region; and a low refractive index layer that is arranged on a resin layer between a low reflection film and the glass plate material and has a refractive index lower than that of the glass plate material, the low reflection film being formed on a front surface of an on-chip lens arranged for every pixel.

Note that the present embodiment is not limited to the embodiment described above, and various modifications can be made without departing from the scope of the present disclosure. Furthermore, effects described in the present specification are merely examples and are not limited, and other effects may be provided.

REFERENCE SIGNS LIST

11 Imaging element chip
12 Sensor substrate
13 Glass substrate
14 Effective pixel region
15 Peripheral region
21 Semiconductor substrate
22 Glass seal resin
23 Color filter layer
24 On-chip lens layer
25 Low reflection film
31 Glass plate material
32 Glass seal resin
33 Glass seal resin
34 Pseudo low refractive index layer
41 Hole layer
42 Oxide film
51 Fine concave shape

The invention claimed is:

1. A solid-state imaging element comprising:
   a semiconductor substrate on which a pixel region in which a plurality of pixels is arranged is formed;
   a glass plate material that is bonded to the semiconductor substrate so that a gap is not provided between the glass plate material and the pixel region; and
   a low refractive index layer that is arranged on a resin layer between a low reflection film and the glass plate material and has a refractive index lower than that of the glass plate material, the low reflection film being formed on a front surface of an on-chip lens arranged for every pixel of the plurality of pixels.

2. The solid-state imaging element according to claim 1, wherein the low refractive index layer is formed by
   a hole layer that is formed on a front surface of the first resin layer and includes a plurality of fine holes having a diameter smaller than a pitch of the plurality of pixels, the first resin layer being formed at a thickness less than an interval from a bonded surface between a sensor substrate having the semiconductor substrate and a glass substrate having the glass plate material to the glass plate material so as to be stacked on the low reflection film; and a film that is formed so as to close the plurality of fine holes as hollows.

3. The solid-state imaging element according to claim 1, wherein
the low refractive index layer includes a second resin layer having a refractive index lower than that of the glass plate material.

4. The solid-state imaging element according to claim 1, wherein
the low refractive index layer is formed at a thickness of 10 μm to 15 μm.

5. The solid-state imaging element according to claim 1, wherein
the low refractive index layer is formed only in the pixel region when the semiconductor substrate is viewed in a plan view.

6. The solid-state imaging element according to claim 1, wherein
the low refractive index layer is arranged so as to be in contact with the glass plate material.

7. The solid-state imaging element according to claim 1, wherein
the low refractive index layer is arranged so as to be in contact with a bonded surface between a sensor substrate having the semiconductor substrate and a glass substrate having the glass plate material.

8. A manufacturing method of a solid-state imaging element, the solid-state imaging element including a semiconductor substrate on which a pixel region in which a plurality of pixels is arranged is formed, a glass plate material that is bonded to the semiconductor substrate so that a gap is not provided between the glass plate material and the pixel region, and a low refractive index layer that is arranged on a resin layer between a low reflection film and the glass plate material and has a refractive index lower than that of the glass plate material, the low reflection film being formed on a front surface of an on-chip lens arranged for every pixel of the plurality of pixels, the manufacturing method comprising:
forming the low refractive index layer, wherein the forming of the low refractive index layer includes:
forming a hole layer on a front surface of the resin layer, the hole layer including a plurality of fine holes having a diameter smaller than a pitch of the pixels, the resin layer being formed at a thickness less than an interval from a bonded surface between a sensor substrate having the semiconductor substrate and a glass substrate having the glass plate material to the glass plate material so as to be stacked on the low reflection film; and
forming a film so as to close the plurality of fine holes as hollows.

9. An electronic apparatus comprising a solid-state imaging element that includes:
a semiconductor substrate on which a pixel region in which a plurality of pixels is arranged is formed;
a glass plate material that is bonded to the semiconductor substrate so that a gap is not provided between the glass plate material and the pixel region; and
a low refractive index layer that is arranged on a resin layer between a low reflection film and the glass plate material and has a refractive index lower than that of the glass plate material, the low reflection film being formed on a front surface of an on-chip lens arranged for every pixel of the plurality of pixels.

* * * * *